(12) United States Patent
Kim et al.

(10) Patent No.: US 9,721,946 B2
(45) Date of Patent: Aug. 1, 2017

(54) BACKSIDE COUPLED SYMMETRIC VARACTOR STRUCTURE

(71) Applicant: QUALCOMM Incorporated, San Diego, CA (US)

(72) Inventors: Daeik Daniel Kim, Del Mar, CA (US); David Francis Berdy, San Diego, CA (US); Je-Hsiung Jeffrey Lan, San Diego, CA (US); Changhan Hobie Yun, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/298,124

(22) Filed: Oct. 19, 2016

(65) Prior Publication Data
US 2017/0077093 A1 Mar. 16, 2017

Related U.S. Application Data

(62) Division of application No. 14/853,931, filed on Sep. 14, 2015, now Pat. No. 9,502,586.

(51) Int. Cl.
*H01L 29/93* (2006.01)
*H01L 27/108* (2006.01)
(Continued)

(52) U.S. Cl.
CPC ...... *H01L 27/0808* (2013.01); *H01L 21/7624* (2013.01); *H01L 21/78* (2013.01);
(Continued)

(58) Field of Classification Search
CPC ............. H01L 27/0808; H01L 21/78; H01L 29/66174; H01L 29/93; H01L 27/7624; H01L 27/1203; H01L 29/66181
(Continued)

(56) References Cited

U.S. PATENT DOCUMENTS 3,877,053 A 4/1975 Kaplit
5,321,289 A * 6/1994 Baba ................ H01L 29/7813
257/331

(Continued)

FOREIGN PATENT DOCUMENTS

EP 1855315 A1 11/2007

OTHER PUBLICATIONS

International Search Report and Written Opinion—PCT/US2016/045056—ISA/EPO—Jan. 30, 2017.
(Continued)

*Primary Examiner* — Dzung Tran
(74) *Attorney, Agent, or Firm* — Qualcomm Incorporated/Seyfarth

(57) ABSTRACT

A symmetric varactor structure may include a first varactor component. The first varactor component may include a gate operating as a second plate, a gate oxide layer operating as a dielectric layer and a body operating as a first plate of an area modulating capacitor. In addition, doped regions may surround the body of the first varactor component. The first varactor component may be supported on a backside by an isolation layer. The symmetric varactor structure may also include a second varactor component electrically coupled to the backside of the first varactor component through a backside conductive layer.

10 Claims, 7 Drawing Sheets

(51) Int. Cl.
   *H01L 21/70* (2006.01)
   *H01L 21/8238* (2006.01)
   *H01L 27/08* (2006.01)
   *H01L 29/66* (2006.01)
   *H01L 21/762* (2006.01)
   *H01L 27/12* (2006.01)
   *H01L 21/78* (2006.01)

(52) U.S. Cl.
   CPC .... *H01L 27/1203* (2013.01); *H01L 29/66174* (2013.01); *H01L 29/66181* (2013.01); *H01L 29/93* (2013.01)

(58) Field of Classification Search
   USPC .......................................................... 257/602
   See application file for complete search history.

(56) References Cited

U.S. PATENT DOCUMENTS

| | | | |
|---|---|---|---|
| 6,703,273 B2* | 3/2004 | Wang | H01L 29/945 257/E21.396 |
| 8,320,100 B2 | 11/2012 | Kanno et al. | |
| 8,609,479 B2 | 12/2013 | Chen et al. | |
| 8,735,257 B2 | 5/2014 | Huang et al. | |
| 8,803,288 B1 | 8/2014 | Marino et al. | |
| 9,502,586 B1 | 11/2016 | Kim et al. | |
| 2003/0052389 A1 | 3/2003 | Maeda et al. | |
| 2003/0067026 A1 | 4/2003 | Bulucea | |
| 2004/0195643 A1 | 10/2004 | Benaissa et al. | |
| 2005/0179113 A1 | 8/2005 | Kim et al. | |
| 2007/0057302 A1* | 3/2007 | Ho | H01L 28/91 257/301 |
| 2008/0007364 A1 | 1/2008 | Chiba | |
| 2008/0054313 A1* | 3/2008 | Dyer | G03F 9/7084 257/276 |
| 2010/0244113 A1 | 9/2010 | Rieh et al. | |
| 2010/0283093 A1* | 11/2010 | Pei | H01L 21/84 257/303 |
| 2011/0180862 A1* | 7/2011 | Anderson | H01L 21/84 257/296 |
| 2011/0204969 A1 | 8/2011 | Chen et al. | |
| 2013/0100090 A1 | 4/2013 | Felnhofer et al. | |
| 2013/0260486 A1* | 10/2013 | Huang | H01L 29/93 438/18 |
| 2014/0036406 A1 | 2/2014 | Tesson et al. | |

OTHER PUBLICATIONS

Partial International Search Report—PCT/US2016/045056—ISA/EPO—Oct. 28, 2016.

\* cited by examiner

BACKSIDE COUPLED SYMMETRIC VARACTOR STRUCTURE

CROSS REFERENCE TO RELATED APPLICATION

The present application is a divisional of U.S. patent application Ser. No. 14/853,931, filed on Sep. 14, 2015, and entitled "BACKSIDE COUPLED SYMMETRIC VARACTOR STRUCTURE," the disclosure of which is expressly incorporated by reference herein in its entirety.

BACKGROUND

Field

Aspects of the present disclosure relate to semiconductor devices, and more particularly to a backside coupled symmetric varactor structure.

Background

The process flow for semiconductor fabrication of integrated circuits (ICs) may include front-end-of-line (FEOL), middle-of-line (MOL), and back-end-of-line (BEOL) processes. The front-end-of-line process may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line process may include a series of wafer processing steps for interconnecting the semiconductor devices created during the front-end-of-line and middle-of-line processes. Successful fabrication of modern semiconductor chip products involves an interplay between the materials and the processes employed.

Mobile radio frequency (RF) chip designs (e.g., mobile RF transceivers) have migrated to a deep sub-micron process node due to cost and power consumption considerations. The design complexity of mobile RF transceivers is further complicated by added circuit function to support communication enhancements. Further design challenges for mobile RF transceivers include analog/RF performance considerations, including mismatch, noise and other performance considerations. The design of these mobile RF transceivers includes the use of a voltage-controlled capacitance and/or a tunable capacitor (e.g., a varactor) to, for example, provide a voltage controlled oscillator. Varactors may also be known as variable capacitance diodes.

SUMMARY

A symmetric varactor structure may include a first varactor component. The first varactor component may include a gate operating as a second plate, a gate oxide layer operating as a dielectric layer and a body operating as a first plate of an area modulating capacitor. In addition, doped regions may surround the body of the first varactor component. The first varactor component may be supported on a backside by an isolation layer. The symmetric varactor structure may also include a second varactor component electrically coupled to the backside of the first varactor component through a backside conductive layer.

A method of fabricating a symmetric varactor structure includes fabricating a first varactor component adjacent to a second varactor component of the symmetric varactor structure on an isolation layer. The method also includes thinning the symmetric varactor structure to expose a body of the first varactor component and a body of the second varactor component. The method further includes depositing and patterning a conductive layer to couple the body of the first varactor component and the body of the second varactor component.

A symmetric varactor structure may include a first varactor component. The first varactor component may include a gate operating as a second plate, a gate oxide layer operating as a dielectric layer and a body operating as a first plate of an area modulating capacitor. In addition, doped regions may surround the body of the first varactor component. The first varactor component may be supported on a backside by an isolation layer. The symmetric varactor structure may also include a second varactor component. The symmetric varactor structure may further include a means for electrically coupling the second varactor component to the backside of the first varactor component.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
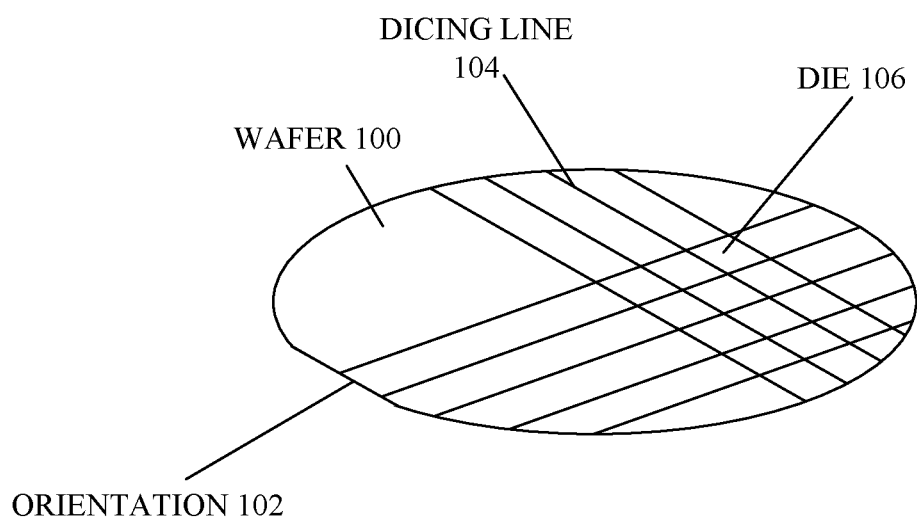
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR," and the use of the term "or" is intended to represent an "exclusive OR."

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of a voltage-controlled capacitance and/or a tunable capacitor (e.g., a varactor), for example, to provide a voltage controlled oscillator. Varactors may also be known as variable capacitance diodes.

A varactor is an example of an electrical device used to store energy (e.g., charge) in an electrical field between closely spaced capacitor plates according to a capacitance value. This capacitance value provides a measure of the amount of charge stored by the capacitor at a certain voltage. In addition to their charge storing capability, capacitors are also useful as electronic filters because they enable differentiation between high frequency and low frequency signals. In a conventional varactor, however, a plate width modulates to vary an electric field formed between the capacitor plates. This varactor proves an electrically controllable capacitance that can be used in tuned circuits. While the use of varactors is advantageous in many applications (e.g., due to small size and reduced cost), varactors generally exhibit a lower quality (Q)-factor and non-linearity because varactors are asymmetric devices.

Linearity is an important factor in mobile RF chip design. Linearity may refer to a circuit behavior in which an output signal varies in direct proportion to an input signal. In a linear device, the output-to-input signal amplitude ratio should be the same, no matter the strength of the input signal. As noted, a varactor is an example of an asymmetric device. For example, conventional standard complementary metal oxide semiconductor (CMOS) varactors cannot implement a full symmetric varactor. This lack of symmetry causes standard CMOS varactors to generate second and third order harmonics that result in signal leakage when used in RF systems. In particular, the use of asymmetric devices in RF systems results in non-linearity from the devices, which prohibits RF system tunablility.

Various aspects of the disclosure provide techniques for fabrication of a backside coupled symmetric varactor. The process flow for semiconductor fabrication of a back-side coupled symmetric varactor may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe a symmetric varactor structure. In one arrangement, a first varactor component includes a gate operating as a first plate, a gate oxide layer operating as a dielectric layer and a body operating as a second plate of a plate area modulating capacitor. In addition, doped regions surround the body, and the first varactor component is supported on a backside by an isolation layer. In this aspect of the present disclosure, the varactor includes an area modulating capacitor in the plate area provided by the body of the varactor that modulates based on a bias voltage received from control ports to control the plate area modulating capacitor. In addition, a second varactor component is electrically coupled to the backside of the first varactor through a backside conductive layer that cancels the second order harmonics caused by a single varactor component.

In this arrangement, the second varactor component may be a duplicate (e.g., Siamese) varactor in which a body of the second varactor component is coupled to the body of the first varactor component to provide a symmetric varactor. By separating the signal and control ports to the first and second varactor components, the backside connection enables a symmetric varactor that cancels out any second order harmonics in an RF system. In addition, a plate area modulating capacitor capability of the first and second varactor components provides improved capacitor linearity. In addition, separate control and signal ports enable higher control versus signal isolation and linearity. In addition, a high Q-factor of the backside coupled symmetric varactor is provided by an increased thickness of the backside conductive layer. A symmetric varactor structure, although incurring an area penalty due to the first and second varactor components, may exhibit a Q-factor improvement.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
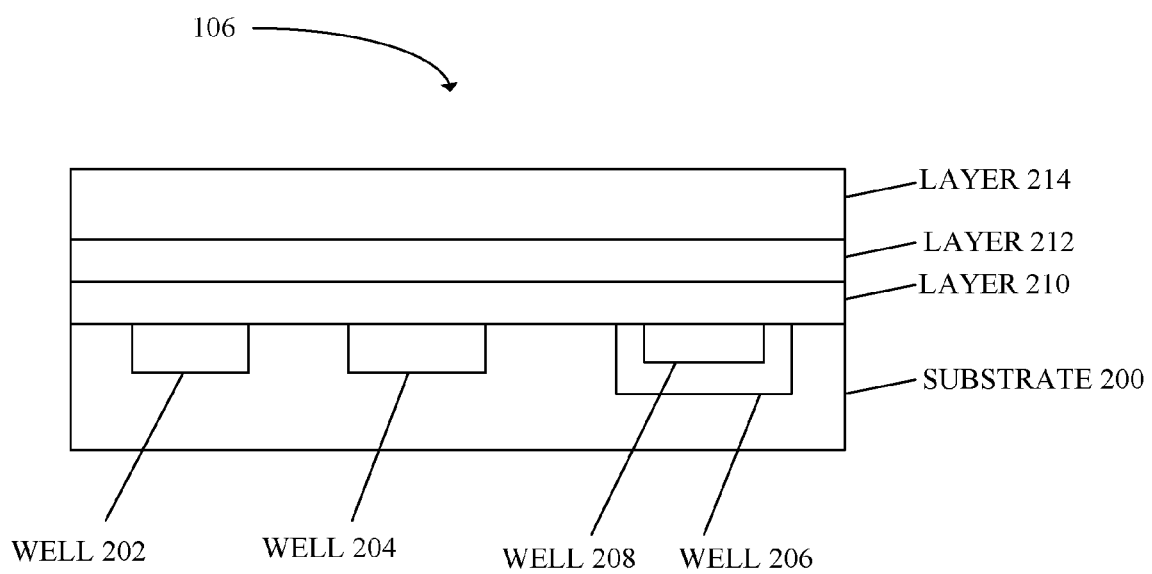
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
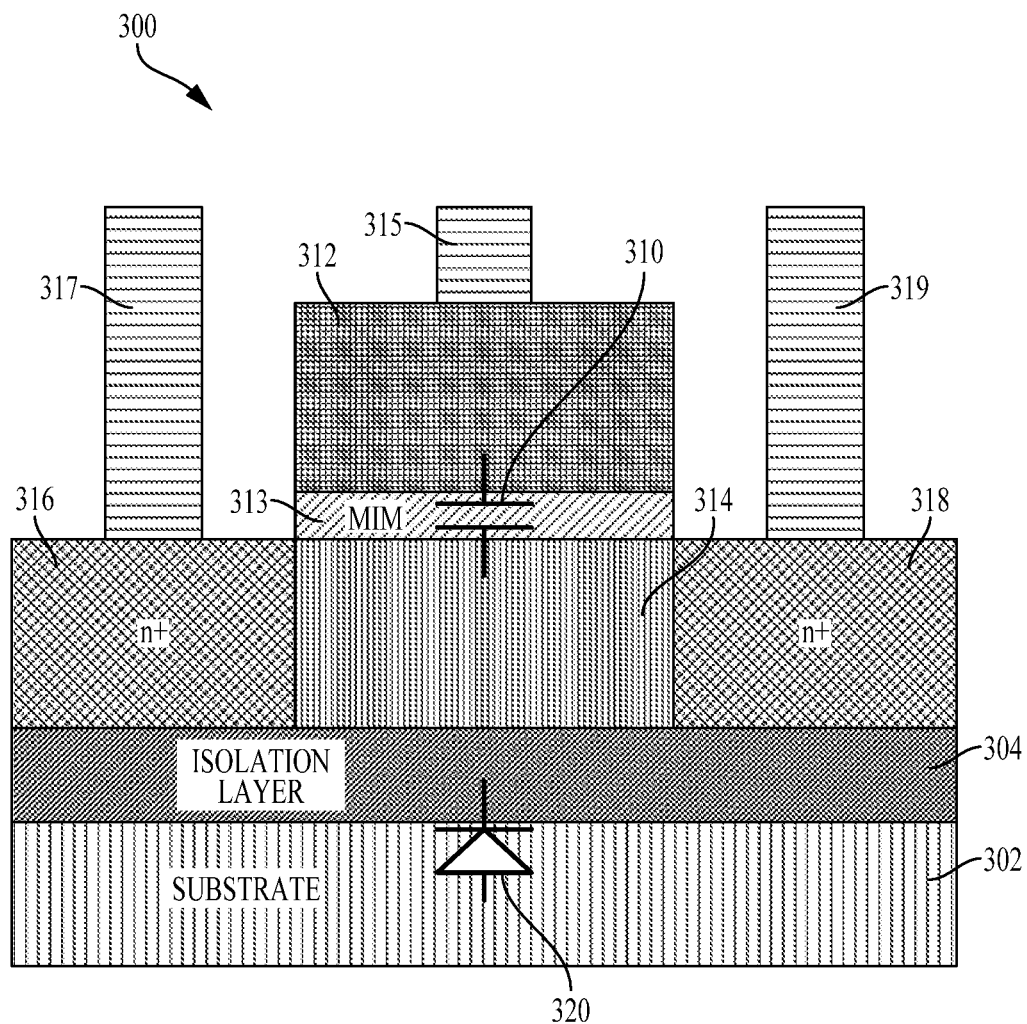
FIG. 3 illustrates a varactor according to an aspect of the present disclosure.

FIG. 3 illustrates a complementary metal oxide semiconductor (CMOS) varactor 300 according to an aspect of the present disclosure. Representatively, the CMOS varactor 300 includes a gate operating as a second plate 314, a gate oxide layer operating as a dielectric layer 313 and a body operating as a first plate 312 of a metal-insulator-metal (MIM) capacitor 310. In addition, a first doped region 316 and a second doped region 318 surround the first plate 312 (e.g., the body) to modulate a distance between the first plate 312 and the second plate 314 of the MIM capacitor 310 to provide a variable capacitance. The CMOS varactor 300 is supported on a backside by an isolation layer 304 (e.g., a buried oxide layer) on a substrate 302 (e.g., handle silicon (Si)). In the CMOS varactor 300, a plate width modulates to vary an electric field formed between the capacitor plates adjusting a distance between the first plate 312 and the second plate 314.

As shown in FIG. 3, the first plate 312 is modulated to vary an electric field formed between the first plate 312 and the second plate 314 according to an input node 315 and output nodes 317 and 319. A capacitance of the MIM capacitor 310 is generally controlled by a thickness of the dielectric layer 313. In the CMOS varactor 300, however, the capacitance is adjusted according to an inversion and depletion between the input node 315 and output nodes 317 and 319, which operates effectively as a diode. Unfortunately, this variable capacitance diode, which operates by varying a distance between the first plate 312 and the second plate 314, is non-linear.

Furthermore, the CMOS varactor 300 also exhibits a parasitic diode 320 between the substrate 302 and the isolation layer 304. The parasitic diode 320 is due to a bonding process used to join the substrate 302 and the isolation layer 304. As a result, the parasitic diode 320 spans an entire wafer, which affects all devices carried by the wafer. The diode exhibited by the MIM capacitor 310 and the parasitic diode 320 prohibits the CMOS varactor 300 from achieving symmetry. That is, any input signal received by the CMOS varactor 300 is distorted regardless of the signal strength.

Unfortunately, the asymmetry of the CMOS varactor 300 generates second, third and fourth order harmonics, which causes signal leakage when used in RF systems. In particular, the use of asymmetric devices in RF systems results in non-linearity from the asymmetric devices, which prohibits RF system tunablility. For example, when the CMOS varactor 300 is used in an RF transceiver that supports carrier aggregation, the artificial harmonics may overlap with channel bands used for the multiple transmit and receive functionalities of carrier aggregation. That is, the second order harmonic may overlap with a second band and the third order harmonic may overlap with a third band used for carrier aggregation.

Figure 4:
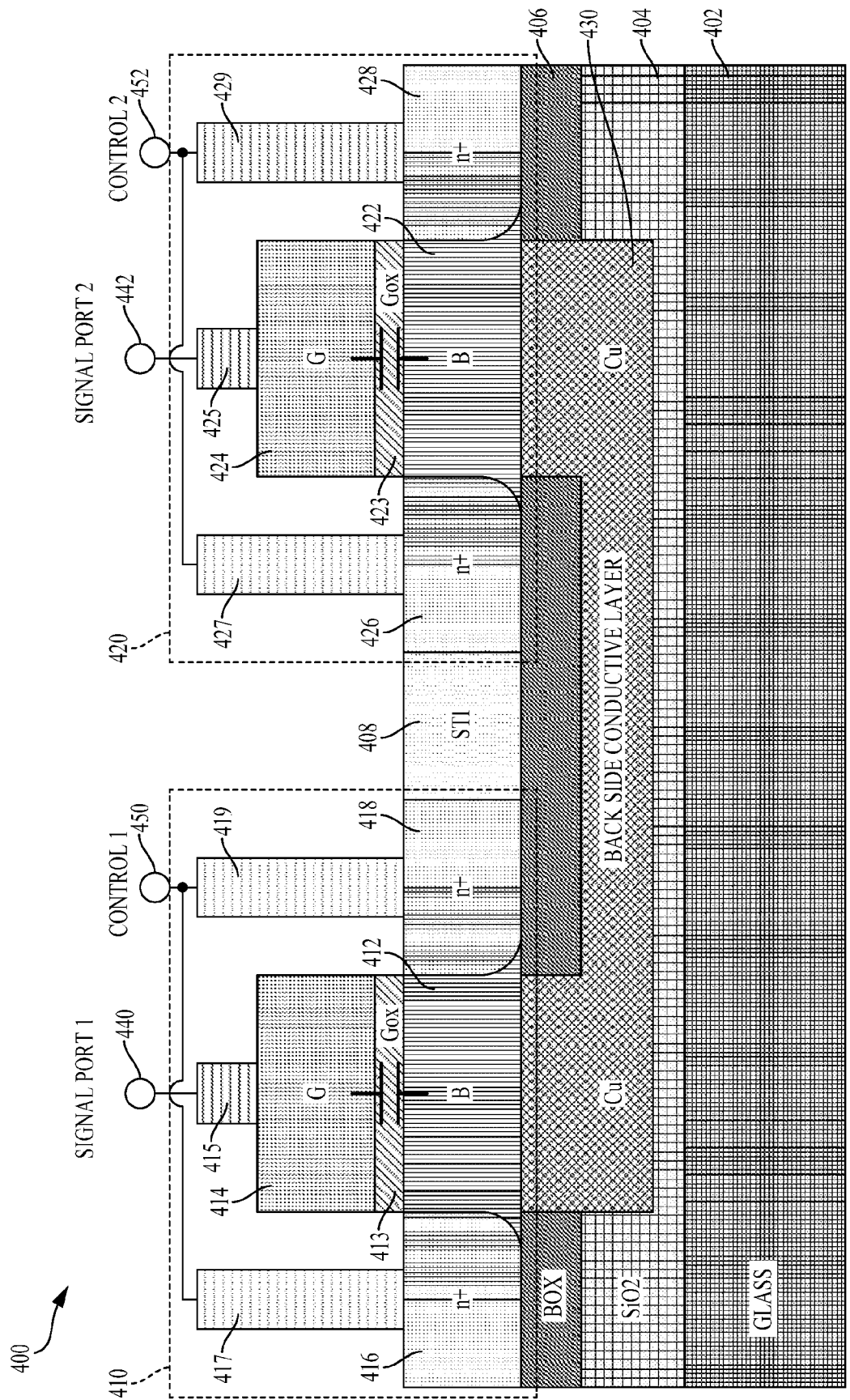
FIG. 4 illustrates a symmetric varactor structure according to aspects of the present disclosure.

FIG. 4 illustrates a symmetric varactor structure 400 according to aspects of the present disclosure. In this aspect of the disclosure, a first varactor component 410 is arranged adjacent to a second varactor component 420 in a Siamese configuration. The symmetry provided by the symmetric varactor structure 400 in the Siamese configuration cancels the second order harmonics. The symmetric varactor structure 400 provides a symmetric varactor through a backside conductive layer 430 coupling the first varactor component 410 to the second varactor component 420.

A thinning and backside conductive interconnect process may form the backside conductive layer 430. The backside conductive layer 430 electrically couples the first varactor component 410 to the second varactor component 420 to provide a symmetric varactor with a reduced cost and an increased Q-factor. For example, a conductive interconnect layer (e.g., a 20 micron thick copper (Cu)) provides a thin-film based backside conductive interconnect (e.g., a copper trace) with reduced resistance. Lateral signal loss is reduced by connecting a body (B) of the first varactor component 410 to a body B of the second varactor component 420. Reducing lateral signal loss in active regions of the symmetric varactor structure is important because lateral signal loss degrades the Q-factor.

Representatively, the first varactor component 410 includes a gate (G) operating as a second plate 414, a gate oxide layer (Gox) operating as a dielectric layer 413 and a body (B) operating as a first plate 412 of an area modulating capacitor. The first varactor component 410 also includes a first doped region 416 and a second doped region 418 surrounding the first plate 412 (e.g., the body B) of the first varactor component 410. In this arrangement, the first varactor component 410 is supported on a backside by an isolation layer 406. The isolation layer 406 may be a buried oxide (BOX) layer.

In this aspect of the disclosure, the second varactor component 420 is electrically coupled to the backside of the first varactor component 410 through the backside conductive layer 430. The second varactor component 420 includes a gate (G) operating as a second plate 424, a gate oxide layer (Gox) operating as a dielectric layer 423 and a body (B) operating as a first plate 422 of an area modulating capacitor. The second varactor component 420 also includes a first doped region 426 and a second doped region 428 surrounding the first plate 422 (e.g., the body B) of the second varactor component 420. In this arrangement, the second varactor component 420 is also supported on a backside by the isolation layer 406.

The backside coupled varactor also includes a first signal port 440 coupled to a gate contact 415 of the gate G of the first varactor component 410. In addition, a first control port 450 is coupled to a first diffusion contact 417 of the first doped region 416, and a second diffusion contact 419 of the second doped region 418. In this arrangement, the first signal port 440 is isolated from the first control port 450. The backside coupled varactor further includes a second signal port 442 coupled to a gate contact 425 of the gate G of the second varactor component 420. In addition, a second control port 452 is coupled to a first diffusion contact 427 of the first doped region 426, and a second diffusion contact 429 of the second doped region 428. In this arrangement, the second signal port 442 is also isolated from the second control port 452. The input signal to the first signal port 440 and/or the second signal port 442 may be an RF signal. In addition, a control signal to the first control port 450 and/or the second control port 452 may be a DC control signal.

In this arrangement, the second doped region 418 of the first varactor component 410 is separated from the first doped region 426 of the second varactor component 420 by a shallow trench isolation (STI) region 408. In addition, the backside conductive layer 430 is covered by a passivation layer 404 that is bonded to a substrate 402. In this arrangement, the first varactor component 410 and the second varactor component 420 are supported by a substrate that may be composed of glass, quartz, silicon, polymer or other like insulator material. In one aspect of the disclosure, bonding the substrate 402 to the passivation layer 404 eliminates the parasitic diode 320 associated with the CMOS varactor 300 shown in FIG. 3.

In operation, a plate area provided by the first plate 412 of the first varactor component 410 modulates based on a bias voltage received from the first control port 450. Similarly, a plate area provided by the first plate 422 of the second varactor component 420 modulates based on a bias voltage received from the second control port 452. For example, an aperture through the body B of the first varactor component 410 modulates according to the bias voltage applied to the first doped region 416 and the second doped region 418 to have little effect on a signal passing through the body B.

In this arrangement, the body B may be fabricated as a partially depleted floating body. This arrangement provides a variable capacitance while maintaining the width of the dielectric layer 413 and the dielectric layer 423. That is, in contrast to modulating a distance between a first plate and a second plate as in the CMOS varactor 300 of FIG. 3, the distance between the first plate 412 and the second plate 414 as well as the first plate 422 and the second plate 424 is maintained. The plate area modulation provided by the first plate 412 and the second plate 424 reduces signal path loss from the diffusion regions (e.g., 416, 418, 426, 428) and the contacts (e.g., 417, 419, 427, 429). By avoiding signal path loss, the symmetric varactor structure 400 provides both symmetry and linearity to enable a high performance RF tunable device.

The symmetric varactor structure 400, including the first varactor component 410 and the second varactor component 420, may be integrated in a circuit to enable a high performance RF tunable device. The circuit may include, but is not limited to a power amplifier (PA) an oscillator (e.g., a voltage controlled oscillator (VCO)), an RF tuner, an RF transceiver, a multiplexor, an RF circuit die or other like RF communication circuit, such as an RF switch. The symmetric varactor structure 400 may exhibit linearity as well as a substantial Q-factor improvement when integrated into a mobile RF transceiver.

Although shown in the arrangement of FIG. 4, it should be recognized that the symmetric varactor structure 400 is not limited to this arrangement. Furthermore, in contrast to the constantly decreasing process nodes, the symmetric varactor structure 400 may be fabricated at a larger process node. For example, the symmetric varactor structure 400 may be fabricated using a one-hundred eight (180) nanometer process node. As a result, an area penalty incurred by the first varactor component 410 and the second varactor component 420 of the symmetric varactor structure 400 is negligible and, therefore, is sacrificed in favor of improved linearity.

Figure 5:
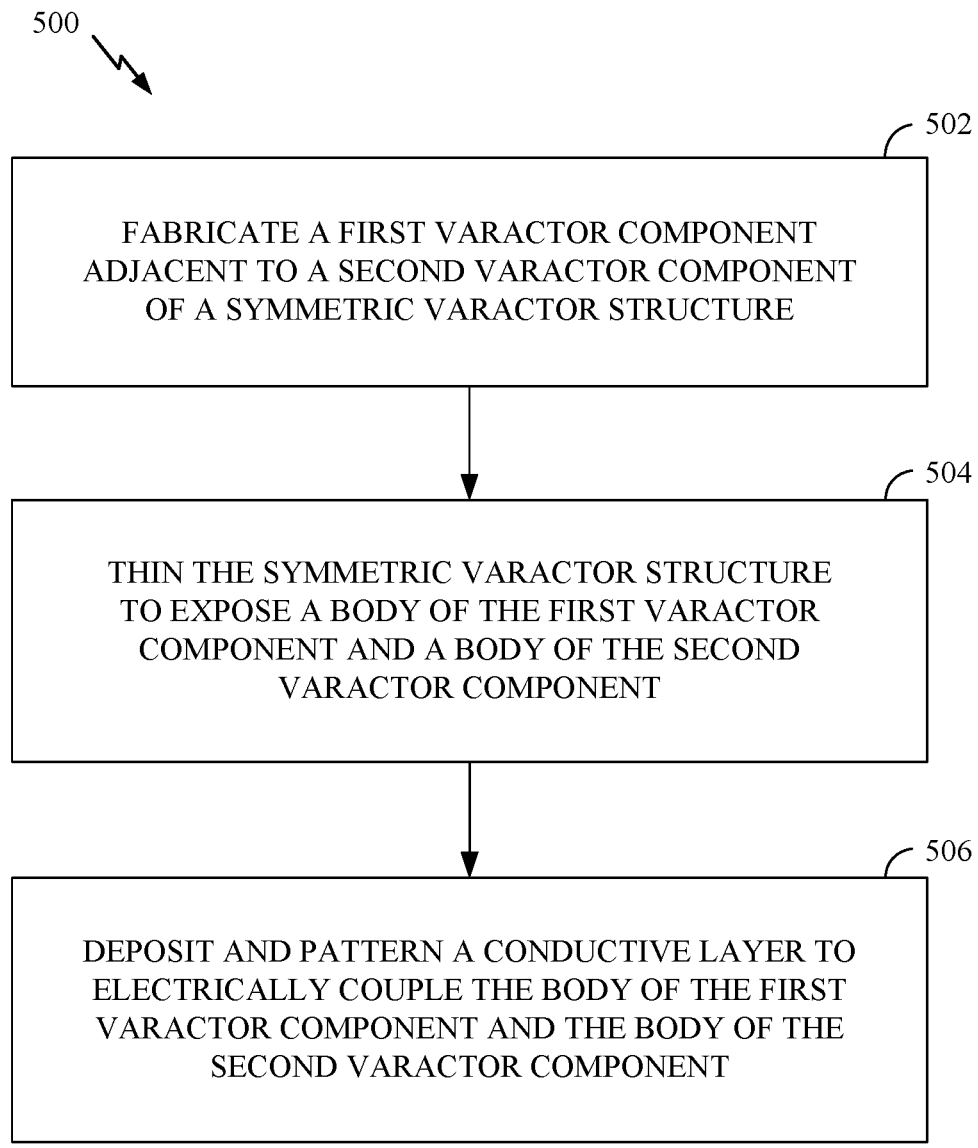
FIG. 5 is a process flow diagram illustrating a method for fabricating a symmetric varactor structure according to an aspect of the present disclosure.

FIG. 5 is a flow diagram illustrating a method 500 of fabricating a symmetric varactor structure according to aspects of the disclosure. At block 502, a first varactor component is fabricated adjacent to a second varactor component of a backside coupled varactor structure. For example, as shown in FIG. 4, a backside of the first varactor component 410 is arranged adjacent to the second varactor component 420 in a Siamese configuration. In this arrangement, the first varactor component 410 and the second varactor component 420 have the same configuration.

Referring again to FIG. 5, at block 504, the varactor structure is thinned to expose a body of the first varactor component and a body of the second varactor component. For example, as shown in FIG. 4, a backside of the symmetric varactor structure 400 is thinned to expose the body B of the first varactor component 410. In addition, the thinning of the backside of the symmetric varactor structure 400 also exposes the body B of the second varactor component 420. Once exposed, the body B of the first varactor component 410 and the body B of the second varactor component 420 may be electrically coupled by using a symmetric backside contact structure.

At block 506, a conductive layer is deposited and patterned to electrically couple the body of the first varactor component and the body of the second varactor component. As shown in FIG. 4, the backside conductive layer 430 electrically couples the first varactor component 410 to the second varactor component 420. In one arrangement, the backside conductive layer 430 is fabricated using a redistribution layer. For example, a redistribution layer (RDL) may be deposited and patterned as the backside conductive layer 430 to couple the body B of the first varactor component 410 and body B of the second varactor component 420. A passivation layer 404 may be deposited and patterned on the backside conductive layer 430. The symmetric varactor structure 400 is completed by bonding a substrate 402 to the passivation layer 404. In one aspect of the disclosure, bonding the substrate 402 to the passivation layer 404 eliminates the parasitic diode 320 associated with the CMOS varactor 300 shown in FIG. 3.

The backside conductive layer 430 provides a symmetric backside contact structure that enables a symmetric varactor with a reduced cost and an increased Q-factor. For example, using a conductive interconnect layer (e.g., a 20 micron thick copper (Cu)) as the backside conductive layer 430 provides a thin-film based backside conductive interconnect (e.g., a copper trace) with reduced resistance. Lateral signal loss is reduced by connecting a body (B) of the first varactor component 410 to a body B of the second varactor component 420. Reducing lateral signal loss in active regions of the symmetric varactor structure 400 is important because lateral signal loss degrades the Q-factor.

In one configuration, a symmetric varactor structure is described. The symmetric varactor structure includes means for electrically coupling a second varactor component to a backside of the first varactor component. In one aspect of the disclosure, the electrical coupling means is the backside conductive layer 430 of FIG. 4, configured to perform the functions recited by the electrical coupling means. In another aspect, the aforementioned means may be a device or any layer configured to perform the functions recited by the aforementioned means.

Aspects of the present disclosure describe a backside coupled symmetric varactor. In one arrangement, a first varactor (also referred to as first varactor component) includes a gate operating as a first plate, a gate oxide layer operating as a dielectric layer and a body operating as a second plate of a plate area modulating capacitor. In addition, doped regions surround the body, and the first varactor is supported on a backside by an isolation layer. In one aspect of the present disclosure, the varactor includes an area modulating capacitor in the plate area provided by the body of the varactor that modulates based on a bias voltage received from control ports to control the plate area modulating capacitor. In addition, a second varactor (also referred to as second varactor component) is electrically coupled to the backside of the first varactor through a backside conductive layer.

In this arrangement, the second varactor may be a duplicate (e.g., Siamese) varactor in which a body of the second varactor is coupled to the body of the first varactor to provide a symmetric varactor. By separating the signal and control ports to the first and second varactors, the backside connection enables a symmetric varactor that cancels our any second order harmonics in an RF system. In addition, a plate area modulating capacitor capability of the first and second varactors provides improved capacitor linearity. In addition, separate control and signal ports enable higher control versus signal isolation and linearity. Furthermore, a high Q-factor of the backside coupled symmetric varactor is provided by an increased thickness of the backside conductive layer. The symmetric varactor structure may be fabricated using a one-hundred eight (180) nanometer process node. As a result, an area penalty incurred by the first varactor component and the second varactor component of the symmetric varactor structure 400 is negligible and, therefore, is sacrificed in favor of improved linearity.

Figure 6:
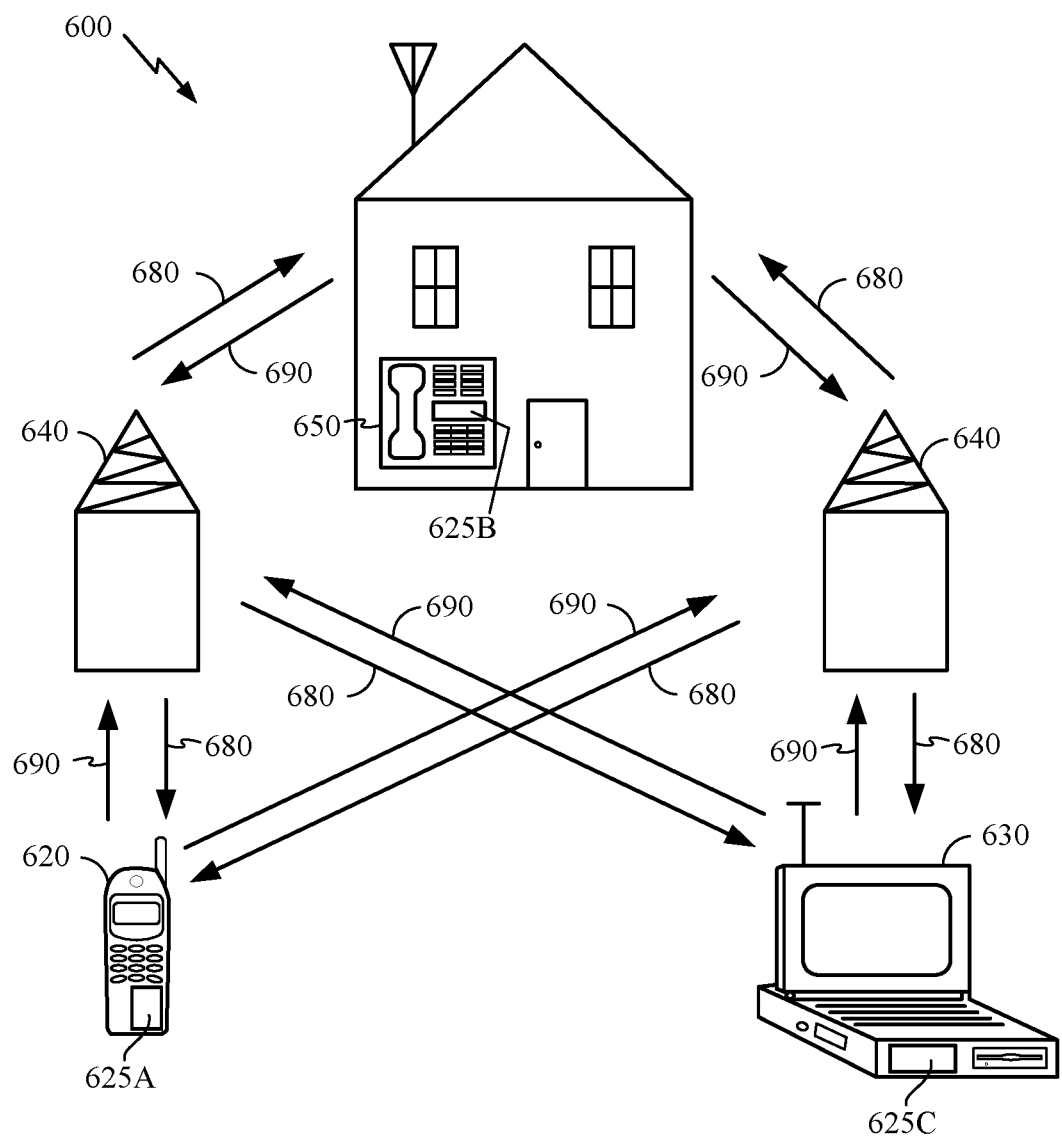
FIG. 6 is a block diagram showing an exemplary wireless communication system in which a configuration of the disclosure may be advantageously employed.

FIG. 6 is a block diagram showing an exemplary wireless communication system 600 in which an aspect of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625C, and 625B that include the disclosed symmetric varactor structure. It will be recognized that other devices may also include the disclosed symmetric varactor structure, such as the base stations, switching devices, and network equipment. FIG. 6 shows forward link signals 680 from the base station 640 to the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units 620, 630, and 650 may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or a communications device that store or retrieve data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the disclosed symmetric varactor structure.

Figure 7:
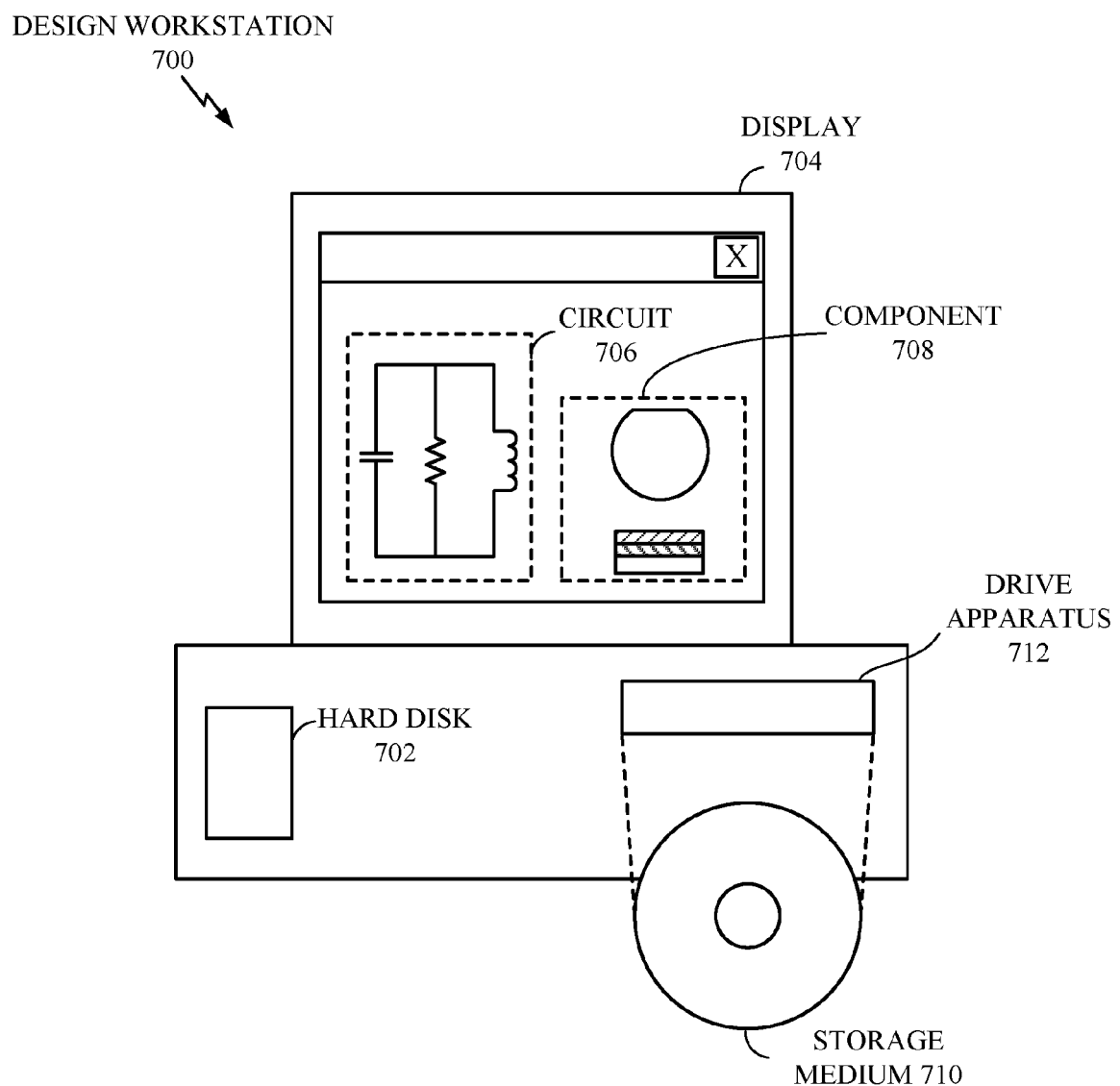
FIG. 7 is a block diagram illustrating a design workstation used for circuit, layout, and logic design of a semiconductor component according to one configuration.

FIG. 7 is a block diagram illustrating a design workstation used for circuit, layout, and logic design of a semiconductor component, such as the symmetric varactor structure. A design workstation 700 includes a hard disk 702 containing operating system software, support files, and design software such as Cadence or OrCAD. The design workstation 700 also includes a display 704 to facilitate design of a circuit 706 or a semiconductor component 708 such as a symmetric varactor structure. A storage medium 710 is provided for tangibly storing the design of the circuit 706 or the semiconductor component 708. The design of the circuit 706 or the semiconductor component 708 may be stored on the storage medium 710 in a file format such as GDSII or GERBER. The storage medium 710 may be a CD-ROM, DVD, hard disk, flash memory, or other appropriate device. Furthermore, the design workstation 700 includes a drive apparatus 712 for accepting input from or writing output to the storage medium 710.

Data recorded on the storage medium 710 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 710 facilitates the design of the circuit 706 or the semiconductor component 708 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "a step for."

What is claimed is:

1. A method of fabricating a symmetric varactor structure, comprising:
    fabricating a first varactor component adjacent to a second varactor component of the symmetric varactor structure on an isolation layer;
    thinning the symmetric varactor structure to expose a body of the first varactor component and a body of the second varactor component;
    depositing and patterning a conductive layer to couple the body of the first varactor component and the body of the second varactor component; and then
    depositing and patterning a passivation layer on a backside surface of the isolation layer and the conductive layer.

2. The method of claim 1, in which depositing and patterning the conductive layer further comprises:
    depositing and patterning a redistribution layer as the conductive layer to couple the body of the first varactor component and the body of the second varactor component.

3. The method of claim 1, further comprising bonding a substrate to only the passivation layer.

4. The method of claim 1, further comprising incorporating the symmetric varactor structure into a chip, the chip integrated into at least one of a music player, a video player, an entertainment unit, a navigation device, a communications device, a personal digital assistant (PDA), a fixed location data unit, and a computer.

5. A method of fabricating a symmetric varactor structure, comprising:
    a step for fabricating a first varactor component adjacent to a second varactor component of the symmetric varactor structure on an isolation layer;
    a step for thinning the symmetric varactor structure to expose a body of the first varactor component and a body of the second varactor component;
    a step for depositing and patterning a conductive layer to couple the body of the first varactor component and the body of the second varactor component; and then
    a step for depositing and patterning a passivation layer on a backside surface of the isolation layer and the conductive layer.

6. The method of claim 5, in which the step for depositing and patterning the conductive layer further comprises:
    a step for depositing and patterning a redistribution layer as the conductive layer to couple the body of the first varactor component and the body of the second varactor component.

7. The method of claim 5, further comprising a step for bonding a substrate to only the passivation layer.

8. The method of claim 5, further comprising a step for incorporating the symmetric varactor structure into a chip, the chip integrated into at least one of a music player, a video player, an entertainment unit, a navigation device, a communications device, a personal digital assistant (PDA), a fixed location data unit, and a computer.

9. The method of claim 1, further comprising forming a shallow trench isolation region on the isolation layer, separating the first varactor component from a first doped region of the second varactor component.

10. The method of claim 5, further comprising a step for forming a shallow trench isolation region on the isolation layer, separating the first varactor component from a first doped region of the second varactor component.

* * * * *